United States Patent
Dent

(10) Patent No.: US 9,190,836 B2
(45) Date of Patent: *Nov. 17, 2015

(54) POTENTIAL ARC FAULT DETECTION AND SUPPRESSION

(71) Applicant: Paul Wilkinson Dent, Pittsboro, NC (US)

(72) Inventor: Paul Wilkinson Dent, Pittsboro, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 14/512,417

(22) Filed: Oct. 11, 2014

(65) Prior Publication Data

US 2015/0043110 A1    Feb. 12, 2015

Related U.S. Application Data

(63) Continuation of application No. 13/225,505, filed on Sep. 5, 2011, now Pat. No. 8,891,211.

(51) Int. Cl.
| | | |
|---|---|---|
| *H02H 3/00* | (2006.01) | |
| *H02H 7/26* | (2006.01) | |
| *G01R 31/02* | (2006.01) | |
| *G01R 31/40* | (2014.01) | |
| *H02S 50/10* | (2014.01) | |
| *G01R 31/28* | (2006.01) | |
| *H02H 1/00* | (2006.01) | |
| *H02H 7/20* | (2006.01) | |

(52) U.S. Cl.
CPC .............. *H02H 7/268* (2013.01); *G01R 31/024* (2013.01); *G01R 31/282* (2013.01); *G01R 31/405* (2013.01); *H02S 50/10* (2014.12); *H02H 1/0015* (2013.01); *H02H 7/205* (2013.01); *Y02B 10/14* (2013.01); *Y04S 10/20* (2013.01)

(58) Field of Classification Search
USPC .......................................................... 361/42
See application file for complete search history.

(56) References Cited

U.S. PATENT DOCUMENTS

| | | | | |
|---|---|---|---|---|
| 8,891,211 | B2 * | 11/2014 | Dent ............................. | 361/42 |
| 2003/0179063 | A1 * | 9/2003 | Preusse et al. ................ | 336/182 |
| 2011/0037600 | A1 * | 2/2011 | Takehara et al. .............. | 340/635 |
| 2011/0090607 | A1 * | 4/2011 | Luebke et al. ................. | 361/42 |
| 2013/0057997 | A1 * | 3/2013 | Dent ............................. | 361/118 |
| 2013/0245614 | A1 * | 9/2013 | Seebruch .................... | 604/891.1 |

\* cited by examiner

*Primary Examiner* — Ronald W Leja
(74) *Attorney, Agent, or Firm* — Coats & Bennett, PLLC

(57) ABSTRACT

A wiring fault detector adapted specifically to address the requirement for arc fault protection specified in National Electrical Code (2011) article 690.11 comprises running at least one additional wire in parallel with the power conductors to be protected, thereby allowing evaluation at the location of a fault detector of an electrical parameter indicative of conductor integrity along its whole length.

In one implementation, the additional conductor allows the voltage drop across the power conductor to be measured and verified to be small and/or noise-free. In another implementation, the additional conductor is a redundant power conductor connected in parallel with the main power conductor, allowing verification that the current flow in both the main and the additional power conductors is partitioned in an expected ratio indicative of wiring integrity.

14 Claims, 13 Drawing Sheets

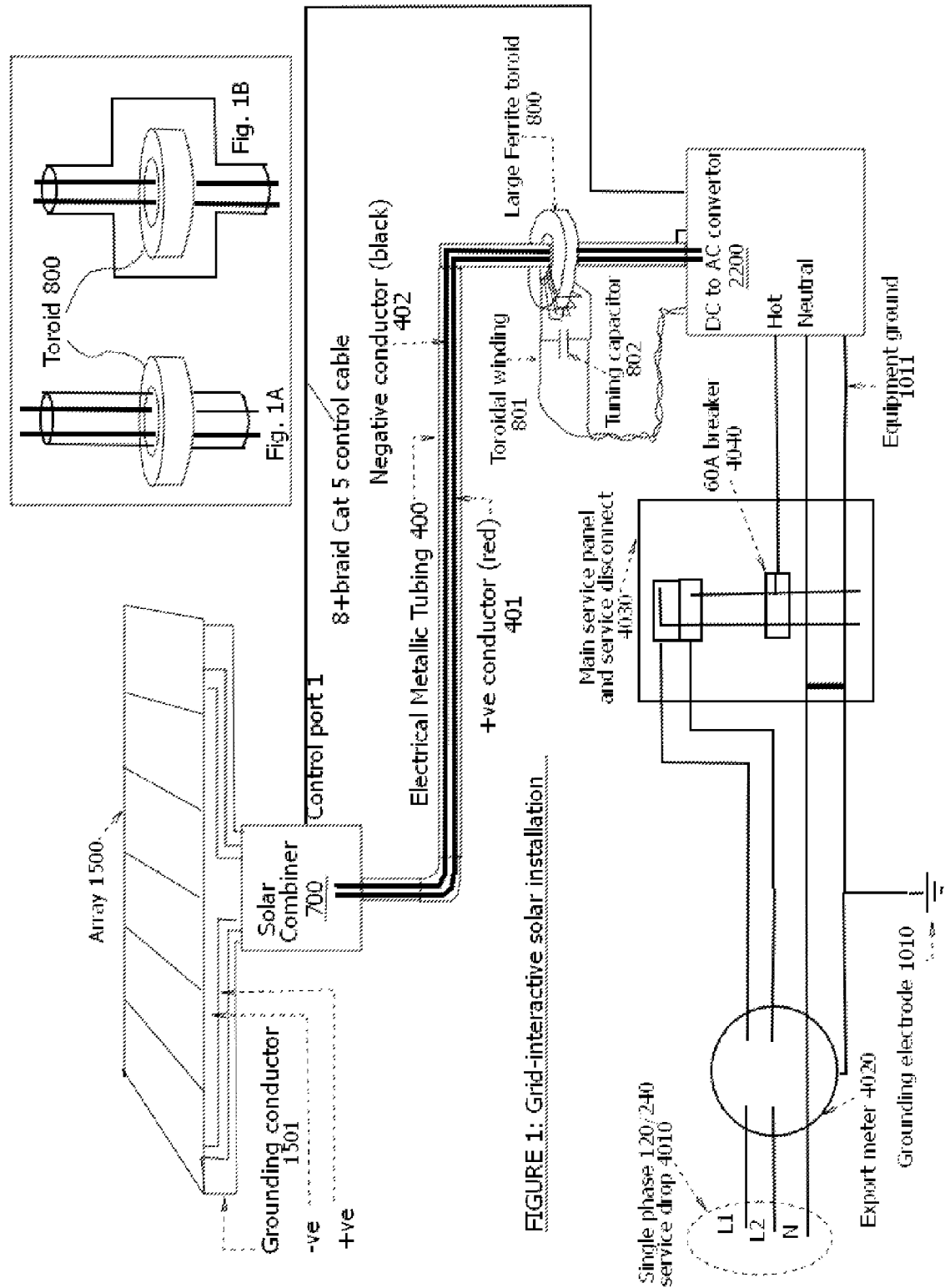
FIGURE 1: Grid-interactive solar installation

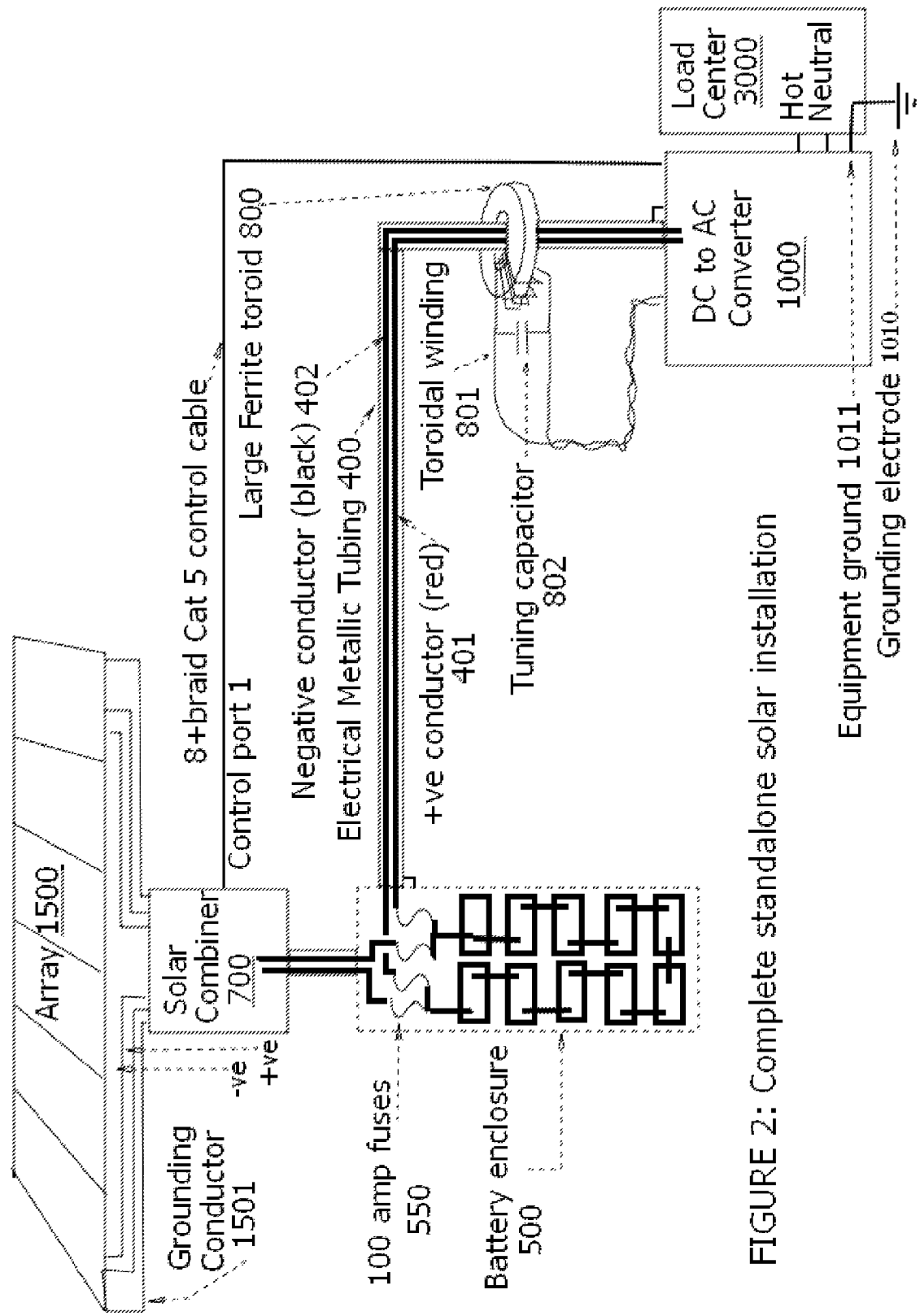
FIGURE 2: Complete standalone solar installation

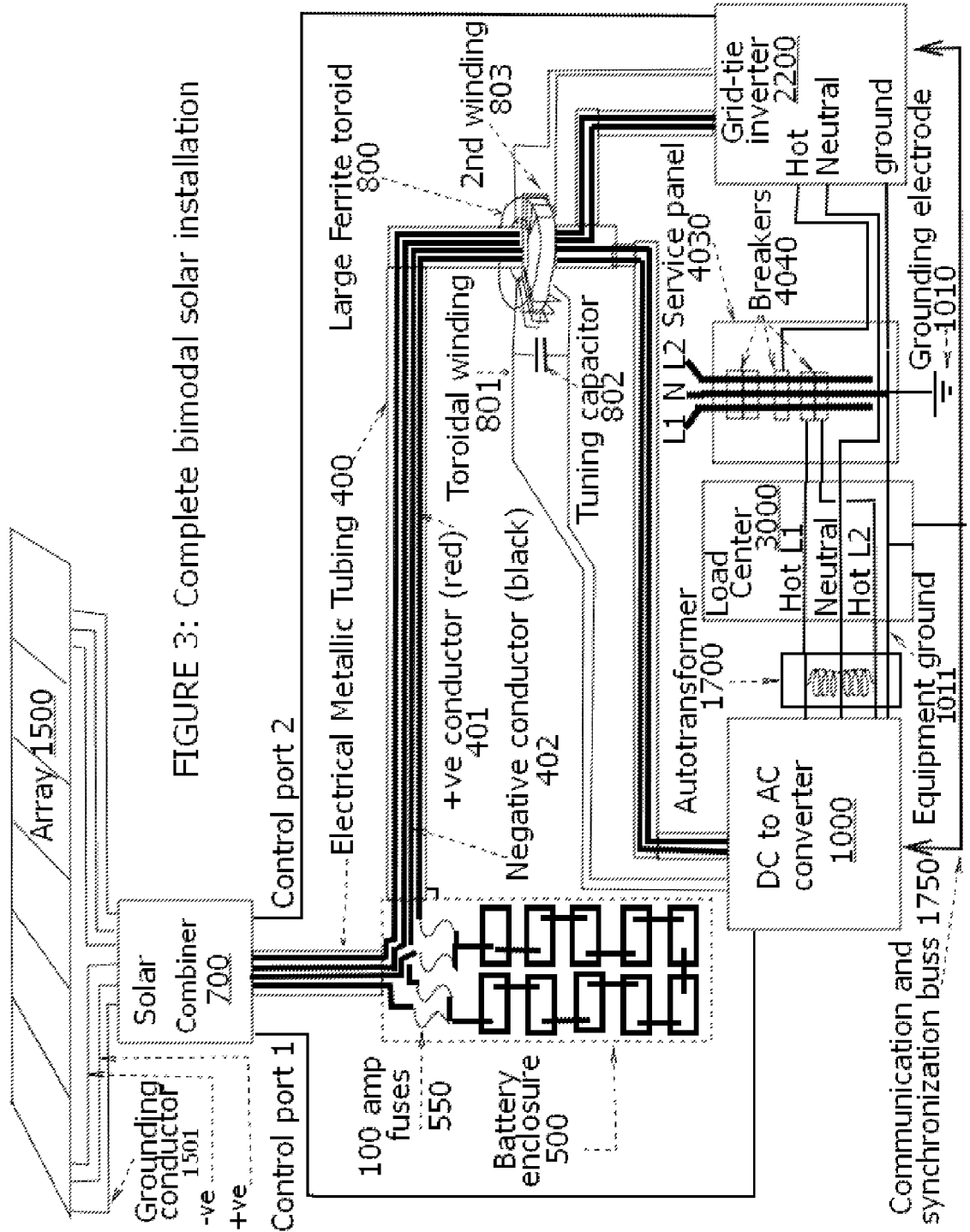
FIGURE 3: Complete bimodal solar installation

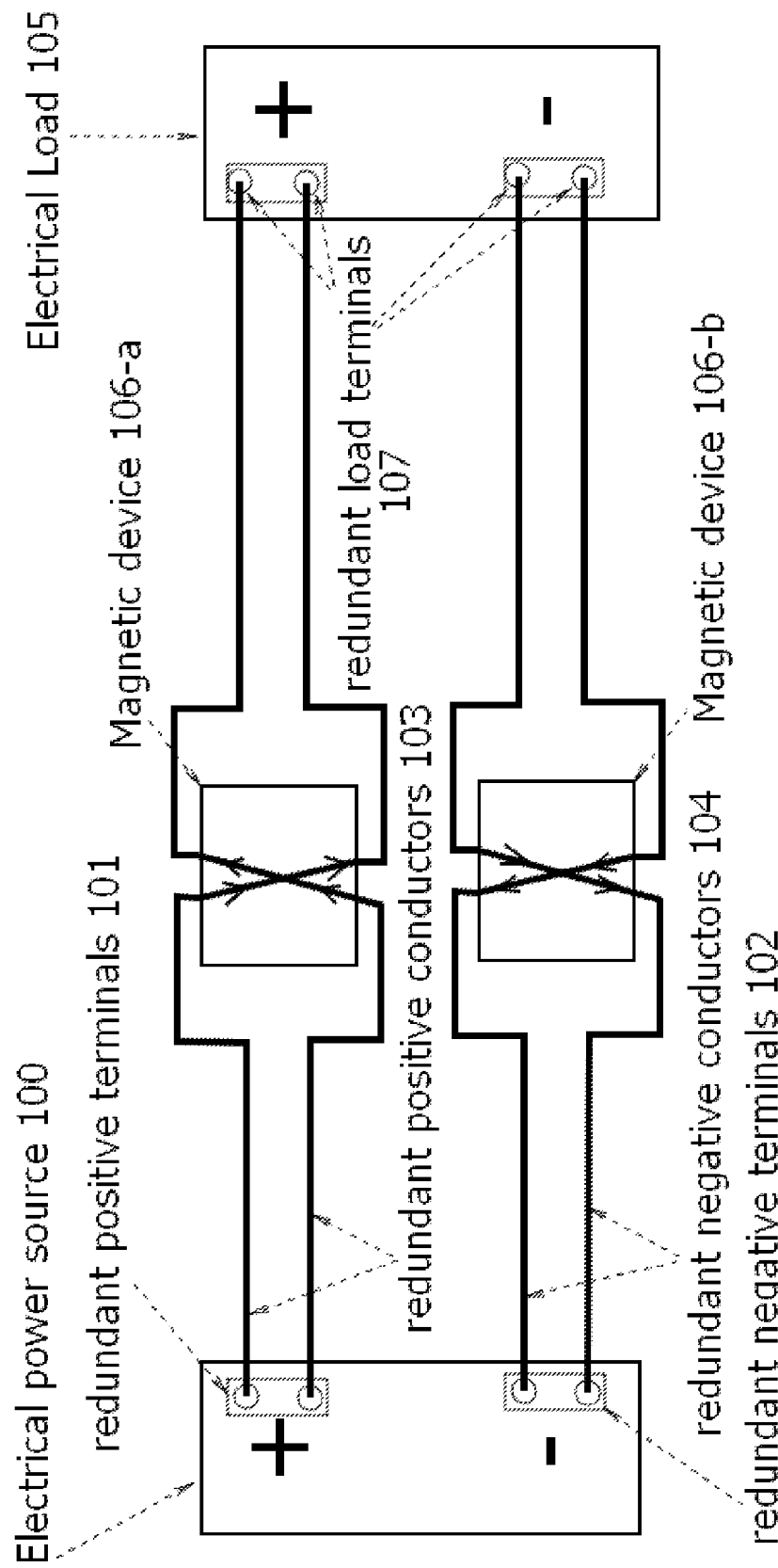
Figure 4: General principle of the wiring integrity detector

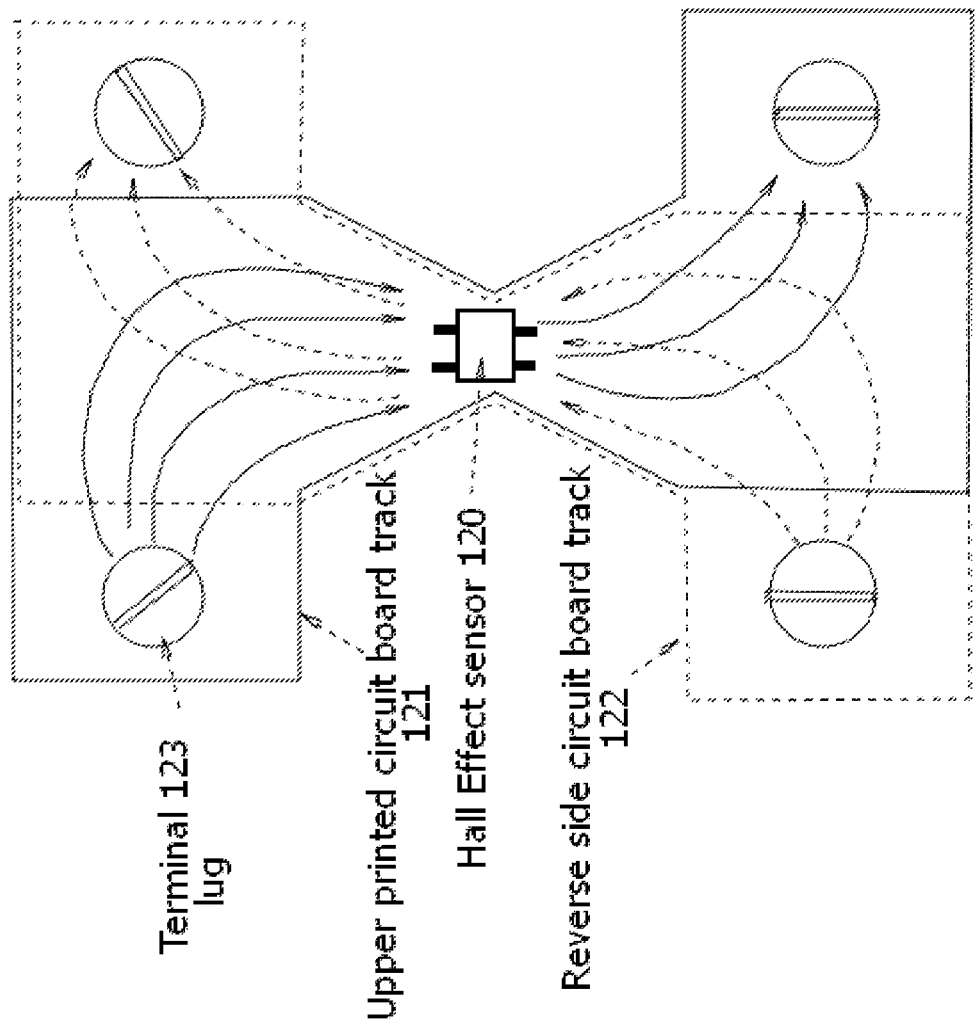

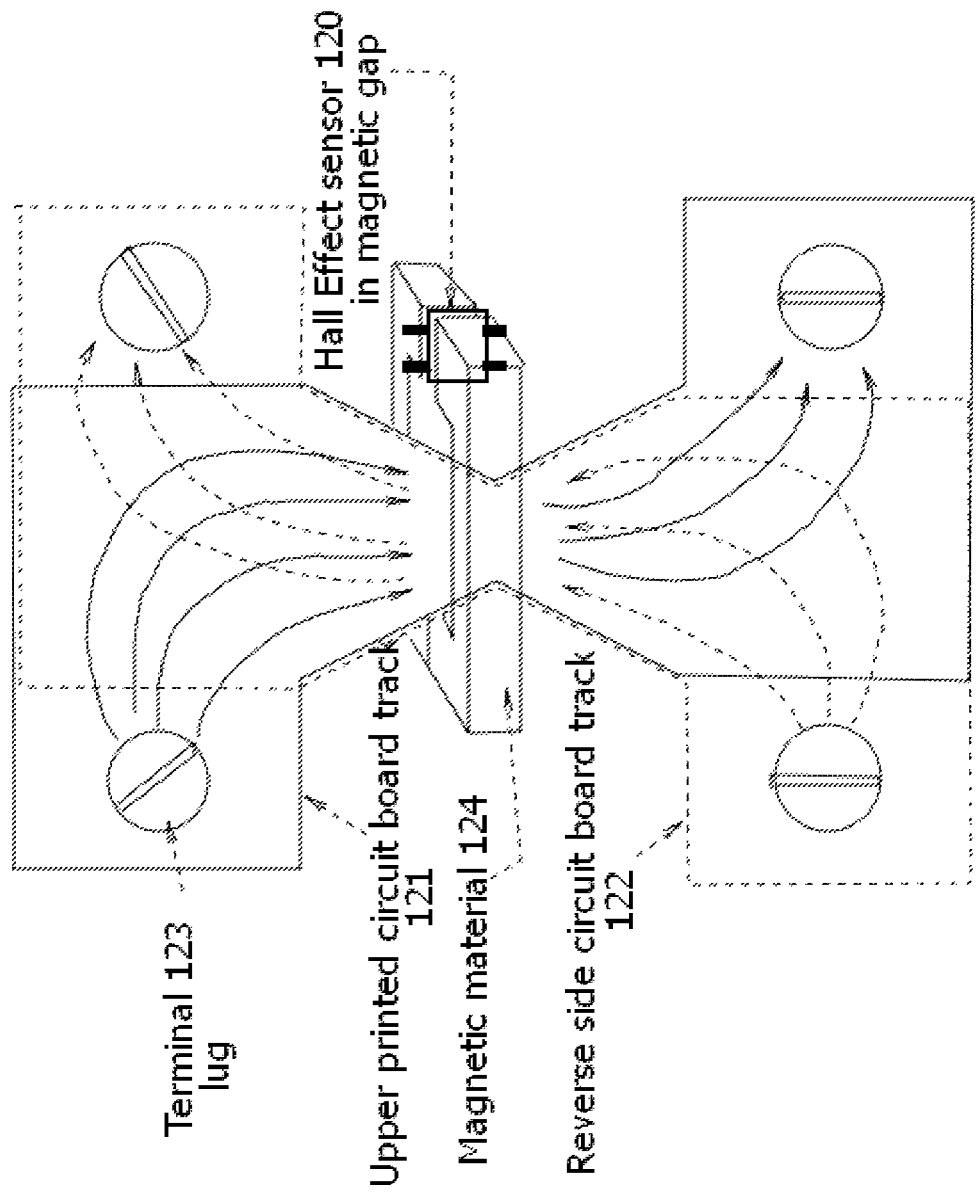

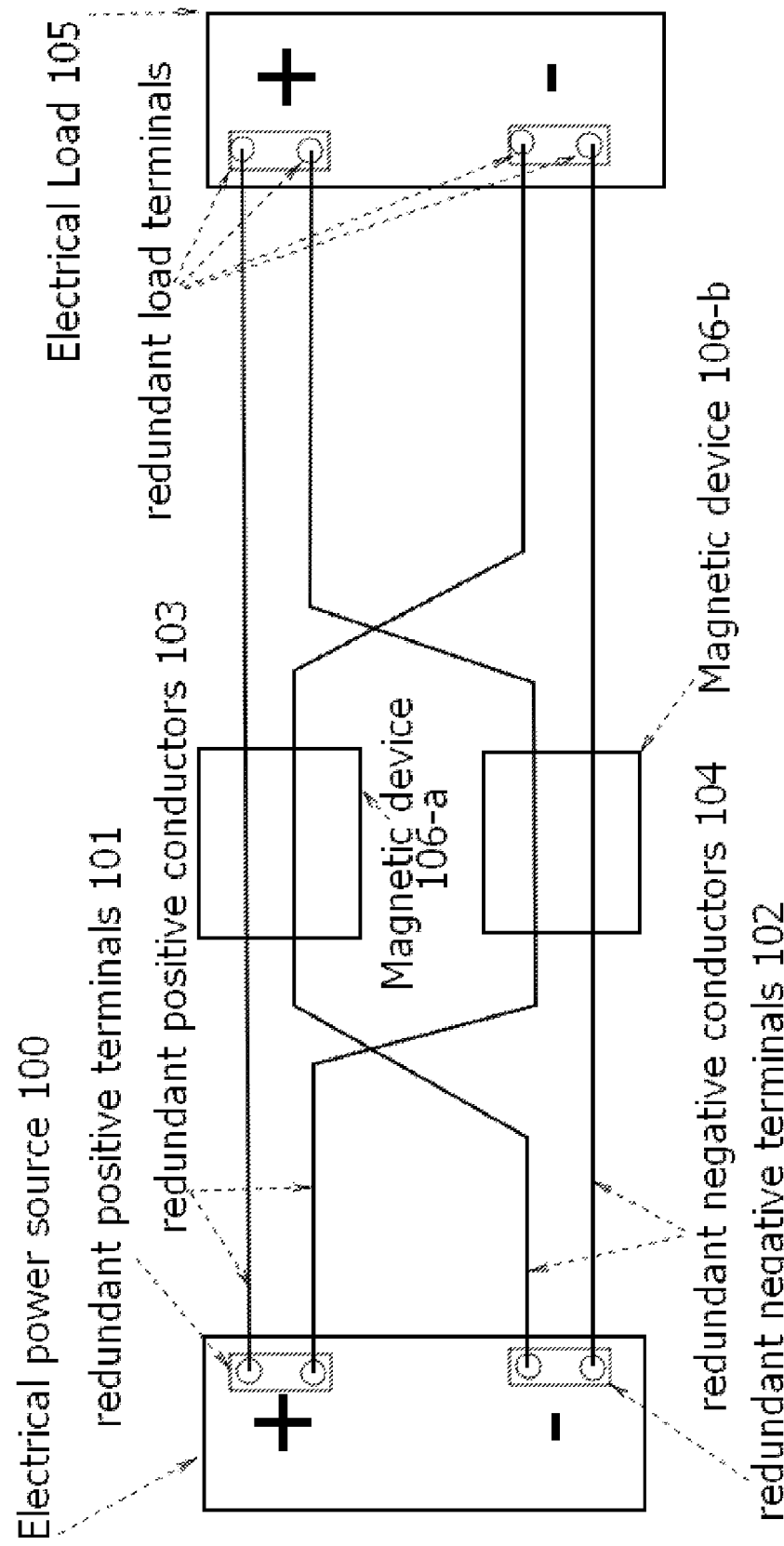
Figure 7: Alternative realization of a first inventive implementation

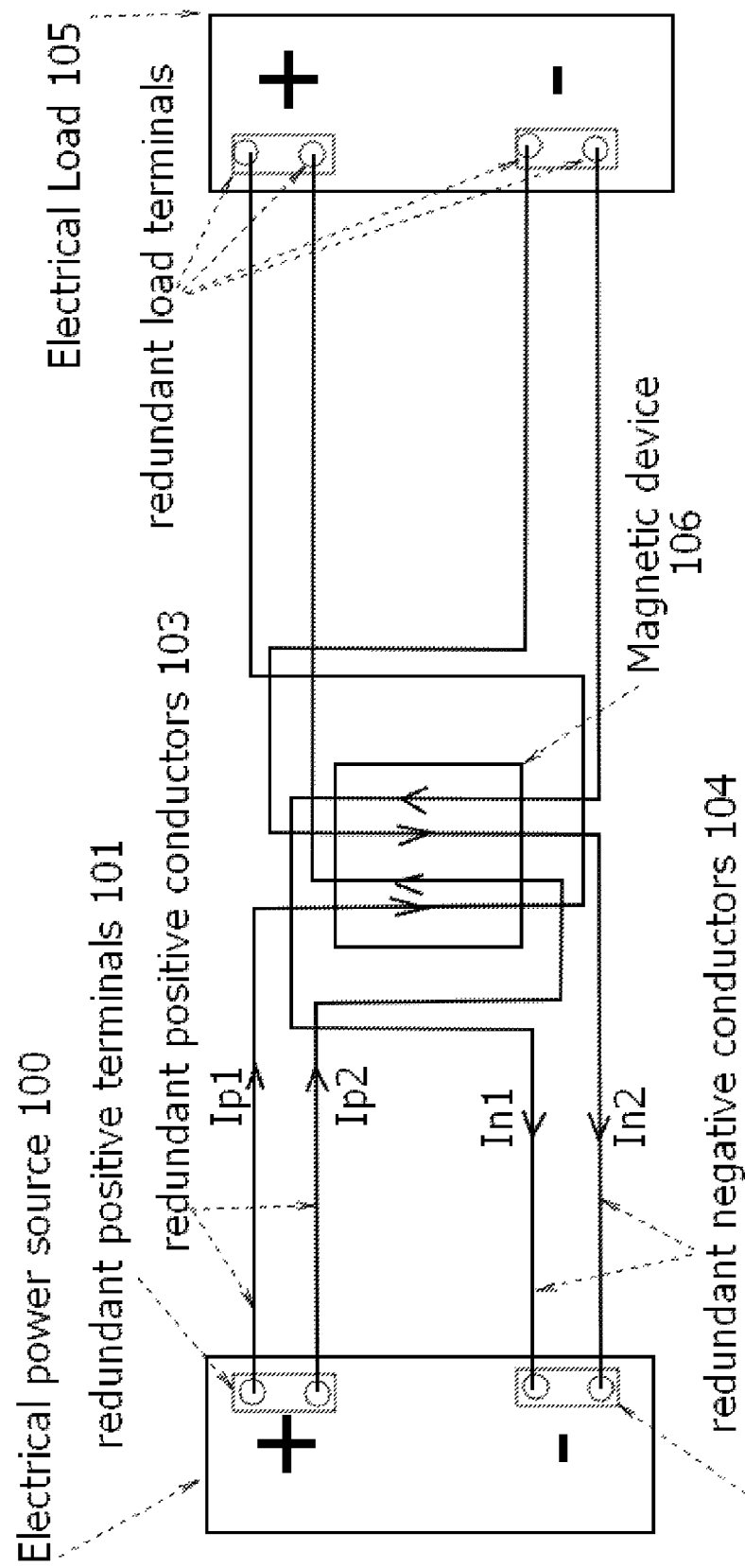
Figure 8: Combination of figures 6 and 7

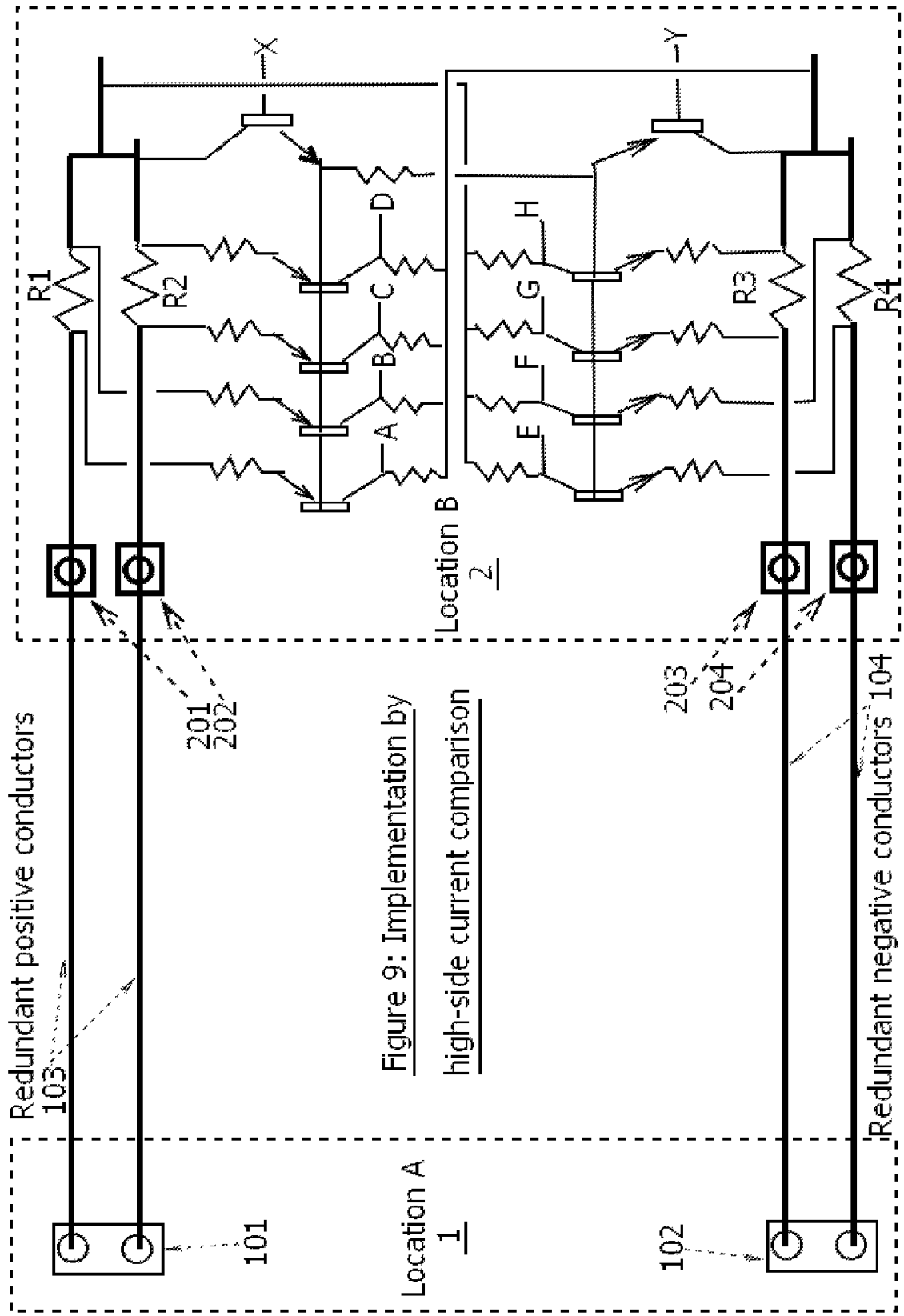

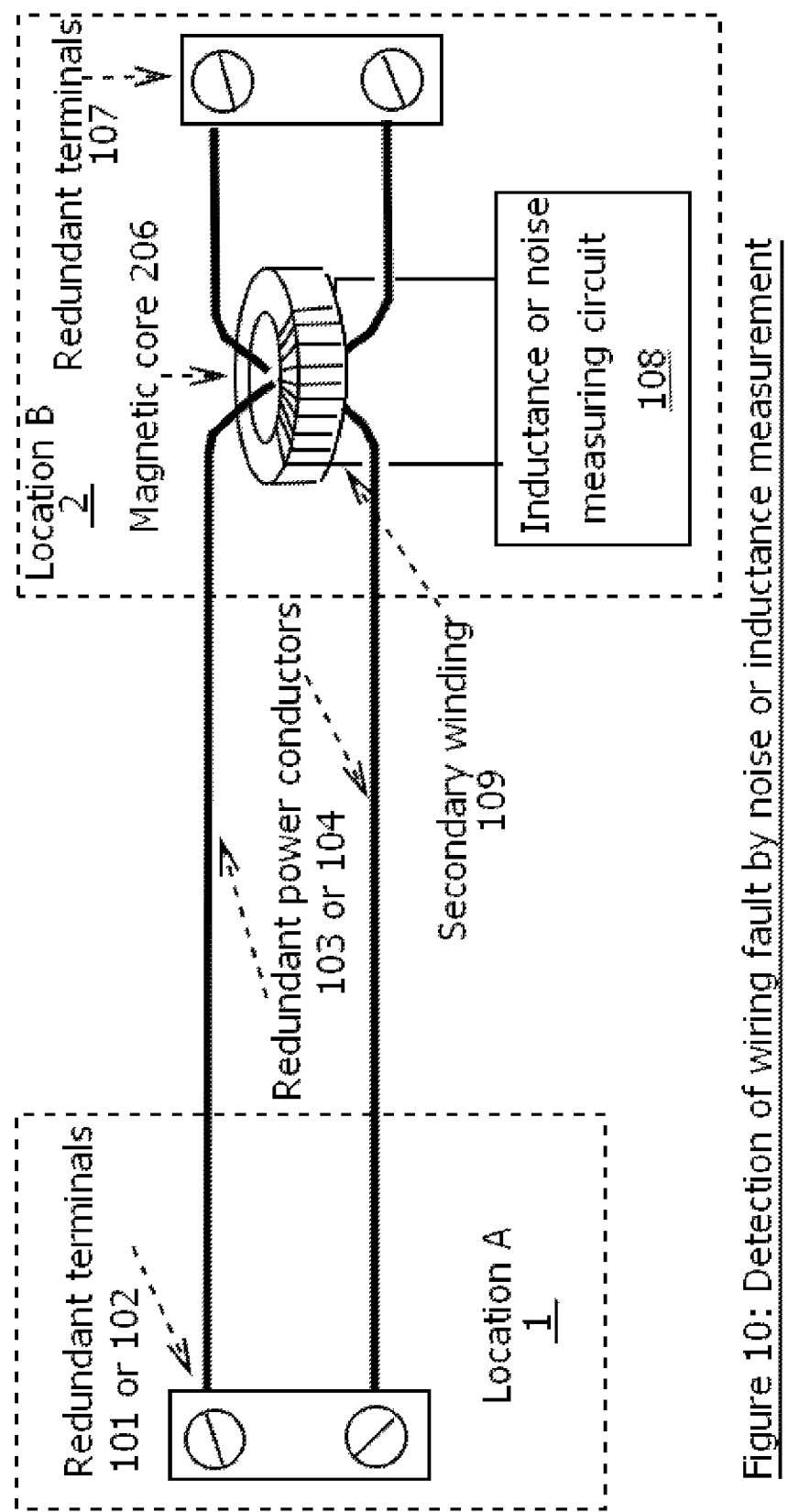
Figure 10: Detection of wiring fault by noise or inductance measurement

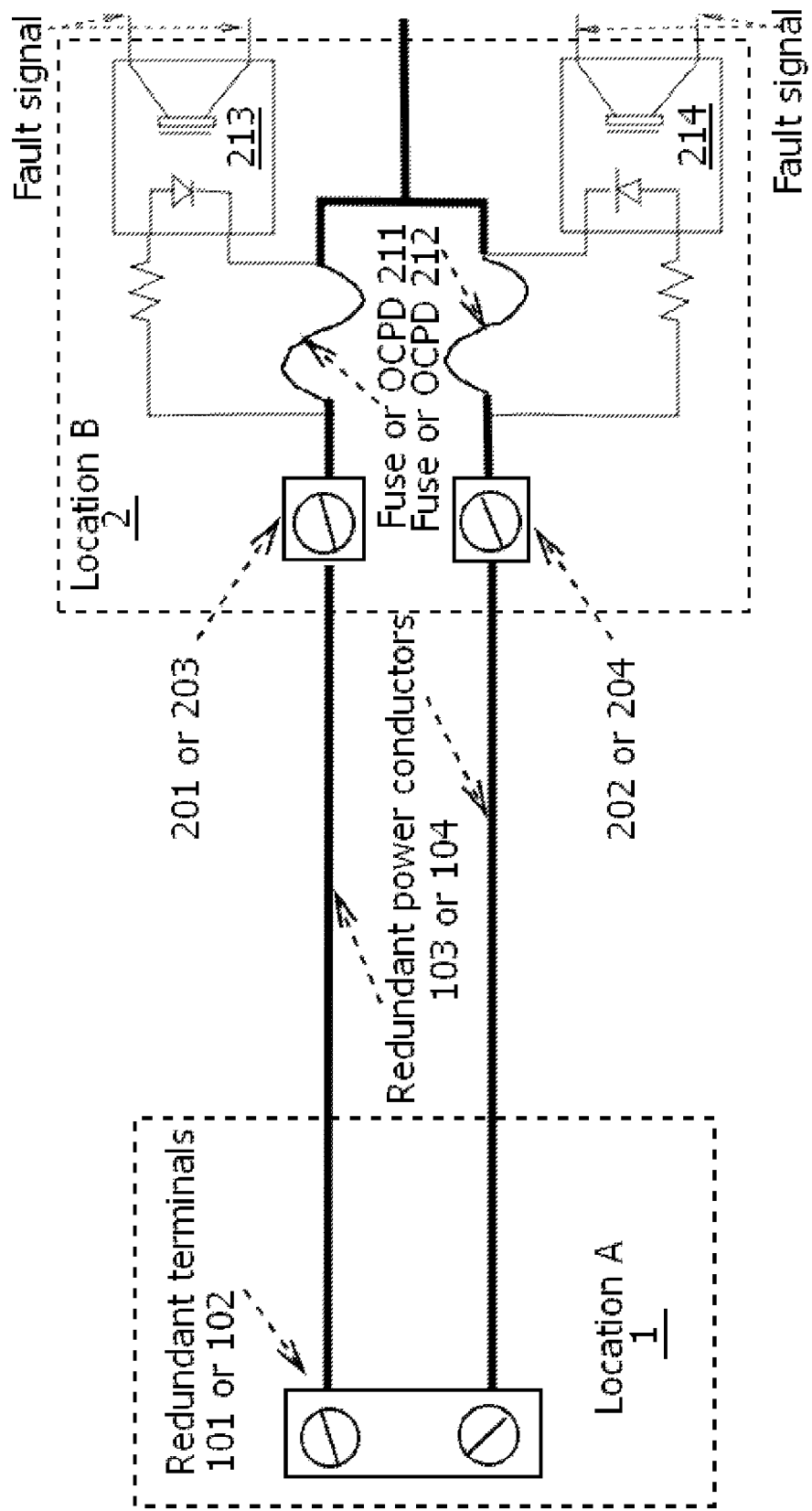
Figure 11: Arc fault suppression using separately fused redundant conductors

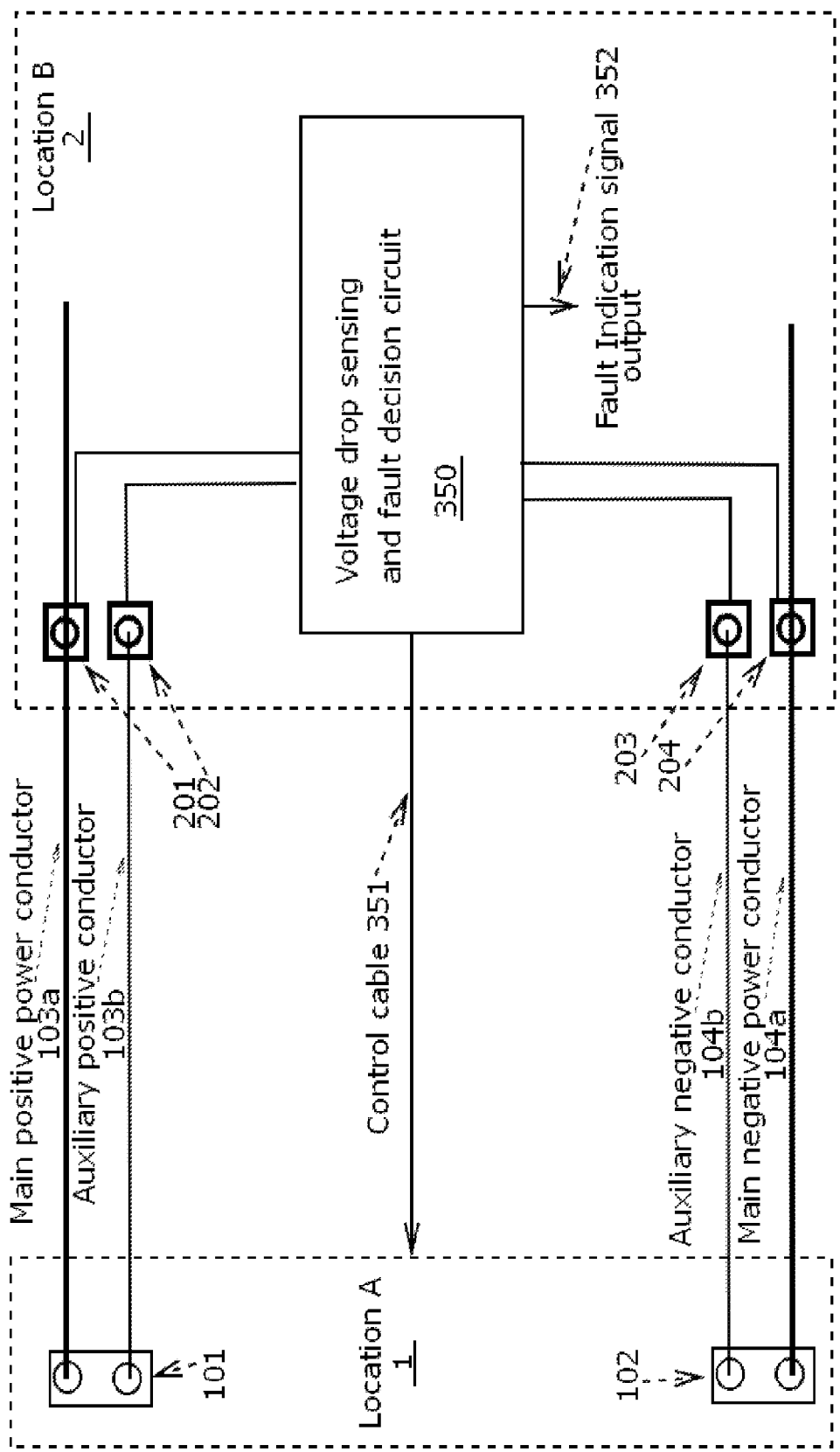
Figure 12: Fault detection by end-to-end voltage drop measurement

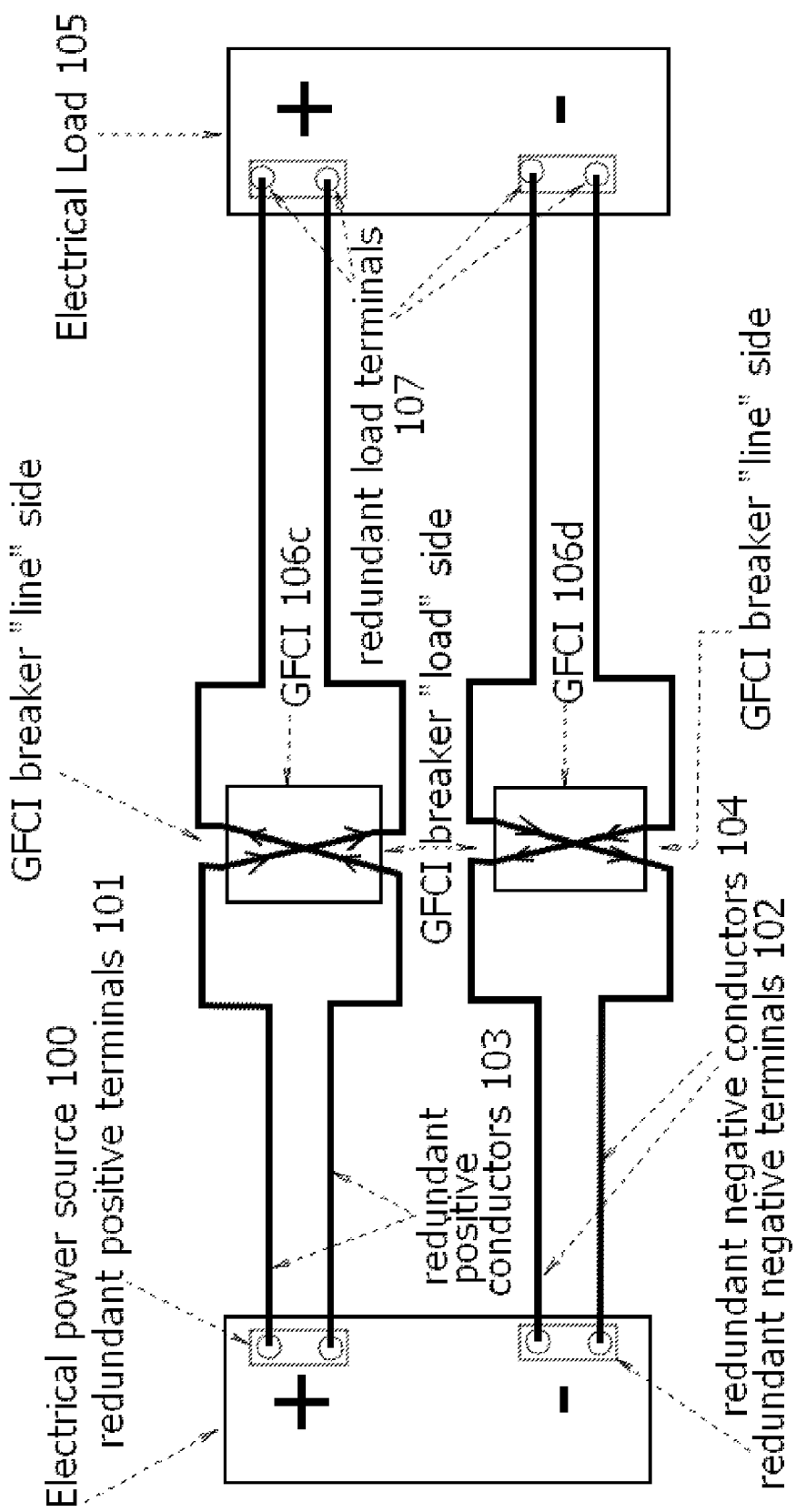
Figure 13: Deliberate mis-wiring of GFCI breakers to perform the invention

POTENTIAL ARC FAULT DETECTION AND SUPPRESSION

BACKGROUND

The present invention relates particularly to Direct Current electrical wiring systems such as used in Photovoltaic energy installations.

Because Photovoltaic systems are relatively new to the mass market, electrical code requirements in the USA for their installation tend to be excessively cautious, raising cost and hindering adoption. For example, the DC wiring from a solar array is required by the National Electrical Code (NEC) to be contained in metal conduit after it enters a building. Normally, metal conduit is not used in residential wiring, and can be hard to retrofit. The NEC is published by the National Fire Prevention Association, which is supported by the insurance industry, and the caution is based on fear of fire caused by electrical faults in houses of wood-frame construction.

In an earlier version of the NEC, a requirement was introduced mandating the use of Arc Fault Circuit Interruption devices (AFCIs) on some residential AC circuits, due to concern about potential fire risk from Arc faults. The 2008 NEC extended the requirement for AFCIs to substantially every room of the house except those locations already using ground fault breakers (GFCIs). Arc fault breakers are between 20 and 100 times the price of ordinary breakers and thus the cost of the electrical installations for new construction increased substantially. It is however hoped that future increases in production and sales volume of AFCIs will bring down their price. The problems of spurious nuisance tripping caused by, for example, vacuum cleaners, use of arc welders or Amateur Radio transmitters and suchlike in the same neighborhood, remain.

In addition, the 2011 NEC imposed a new requirement (art. 690.11) for Photovoltaic systems which requires that, as well as using metal conduit to contain potential arcing, the DC wiring for PV systems over 80 volts shall employ DC AFCIs, despite there being no such device invented at the time of publication.

It is therefore an objective of this invention to disclose a low cost technique for the detection of wiring faults, so that wiring faults that could potentially lead to arcing are detected and mitigated, and arcing is prevented.

SUMMARY

A photovoltaic system comprises a solar array formed by interconnection of a number of solar panels or modules. Solar panels connected in series to reach a desired DC operating voltage form a string. The solar array comprises a number of strings connected in parallel to reach a desired current level.

The strings are connected in parallel by use of a solar combiner. The output current of the combiner is the sum of the string currents, so the output wiring is thicker than the string wiring by a factor approximately equal to the number of strings.

According to the invention, the output wiring of the combiner includes at least one wire additional to the normal positive and negative wires running between a source located at a first location and a load located at a second location.

The at least one additional wire may be connected either directly or through a current limiting component such as a resistor, fuse or lamp to a terminal bonded to the terminal of a power conductor at one of the first and second locations and is connected to a fault detector at the other of the first and second locations. The fault detector is also connected to the power conductor at the location of the fault detector. The fault detector compares an electrical parameter on the at least one additional conductor with a similar electrical parameter on the power conductor and produces a fault indication based on the comparison In a first implementation, the additional wires form redundant current paths that share the current in an expected ratio, and the electrical parameters compared by the fault detector are electrical currents. Detecting that the current in any conductor has departed from the expected ratio provides an indication of a fault. An advantage of the first implementation is that, upon a wire becoming open circuit or partially open circuit at a fault point, the only voltage developed across the fault is the small voltage drop across the remaining wires, which is insufficient to cause arcing or excessive heat dissipation.

In a second implementation, one of the additional wires is used to return a sample of the voltage on the terminal at one end of a power conductor to the other end of the conductor, and the electrical parameters compared by the fault detector are electrical voltages, thereby allowing the fault detector to measure the voltage drop across the power conductor and its terminal connections. If the monitored voltage drop exceeds a preset threshold, or varies in a manner characteristic of an intermittent connection, a signal indicative of a fault is generated.

In a third implementation, one or more of the at least one additional wires is used to carry a signal from the fault detector to a remote circuit disconnecting device.

In a fourth implementation, one or more of the additional wires is used to carry signals from a remote fault detector to a local indicating device for indicating which of the power wires has developed a fault.

A preferred realization of the first implementation comprises using two identical wires for the power line of the first polarity (or phase, in the case of AC), and likewise two identical wires for the power line of second polarity (or phase). Each of the pair of wires of like polarity normally carries almost exactly half the total current, which is flowing in the same direction on both wires of the same polarity. Detecting a difference in the magnitude of the current on a pair of the identical wires of the same polarity is thus indicative of a fault. A preferred detector is a Hall Effect sensor comprising a ring or toroid of magnetic material with a Hall Effect device inserted in a gap in the magnetic material. The pair of wires of the same polarity are passed in opposite directions through the toroid such that the magnetic field due to their currents cancels. If a non-zero magnetic field is sensed by the Hall Effect device, a fault is indicated.

Another realization of the first implementation comprises running one wire of each polarity in the same direction through a Hall Effect sensor. Since the currents on wires of opposite polarity are normally equal and opposite, magnetic field cancellation occurs in the absence of a fault. However, should a wire become faulty, the current doubles in the remaining, redundant wire, causing magnetic field imbalance indicative of a fault. The latter realization is similar in principal to the operation of a ground fault detector, but, due to the use of redundant current paths in this invention, it provides an indication of open-circuit or partially open circuit faults instead of ground faults. Depending on the configuration of the system, it may additionally provide ground fault detection.

Other electrical parameters can be used for fault detection; for example, measuring the change of inductance of a secondary winding wound on the above toroid when an open circuit or partially open circuit fault removes the short-circuited turns constituted by the pair of power wires that are in parallel between the source and the load. Bad or intermittent wiring that in the prior art would have caused arcs can also be detected by detecting electrical noise or crackling signals in a secondary winding of such a toroid.

A solar combiner having a remote-controlled DC disconnect capability is a suitable device for automatically interrupting the source of current upon a wiring fault being indicated as a control signal to the combiner. Such a combiner is disclosed in U.S. Pat. No. 8,937,822 to current Applicant. U.S. Pat. No. 8,937,822 is hereby incorporated by reference herein in its entirety.

BRIEF DESCRIPTION OF THE DRAWINGS

FIG. 1 is the block diagram of a photovoltaic installation for grid-interactive use.

FIG. 1A illustrates passing the shielding conduit through the toroid center

FIG. 1B illustrates passing shielding conduit around the outside of the toroid FIG. 2 is a block diagram of a photovoltaic system providing battery back-up FIG. 3 is a block diagram of a bimodal photovoltaic system providing both battery back-up and grid-interactive operation.

FIG. 4 shows the general principle of an inventive wire-integrity detector based on conductor redundancy.

FIG. 5 shows a hypothetical implementation of the invention.

FIG. 6 shows use of a magnetic concentrator

FIG. 7 shows an alternative realization of a first implementation of the invention.

FIG. 8 shows a single detector through which all conductors pass.

FIG. 9 shows a "high side" current comparison implementation.

FIG. 10 shows an implementation based on measuring inductance or noise levels.

FIG. 11 shows arc fault prevention using separately fused redundant wiring.

FIG. 12 shows an implementation by direct voltage drop measurement.

FIG. 13 shows how to mis-wire a GFI breaker to perform the invention

DETAILED DESCRIPTION

The invention will be described in the context of a Direct Current wiring system, such as a Photovoltaic installation, but it may be realized that the invention can also be applied to other DC systems than Photovoltaic systems, and may also be applied to Alternating Current systems. FIGS. 1, 2 and 3 correspond to FIGS. 17, 18 and 19 respectively of the above-incorporated U.S. Pat. No. 8,937,822 and are included to show the position of elements of a complete solar system within which the current invention may be usefully employed. A complete description of FIGS. 1, 2 and 3 may be found in the incorporated application as descriptions of that application's FIGS. 17, 18 and 19.

In DC systems, a go- and return-conductor between a source and a load may be labeled as having a positive voltage polarity or a negative voltage polarity. In an AC system, the go and return conductors between a source and a load would alternatively be labeled in the case of a single phase system as "hot" and "neutral" conductors, or "hot L1" and "hot L2" in the case of a split-phase, 120/240 volt system, or as "L1, L2 and L3" in the case of a 3-phase system.

Hereinafter the invention will be described using the DC terminology of "polarity", i.e. positive and negative, for the go- and return-conductors, but it shall be understood that these terms may encompass the equivalent conductors, such as hot and neutral, or L1 and L2 of an AC system.

The general principle of a first implementation of an inventive wiring integrity detector for preventing arc faults is shown in FIG. 4.

An electrical source (100) is shown as a DC source with positive and negative terminals (101,102); however, as stated above, the invention is not limited to operation with DC. Each of the positive (101) and negative (102) terminals of source (100) is replicated to provide redundancy. In addition, the corresponding terminals (107) of the load (105) are similarly replicated. All replicated terminals of the same polarity are solidly bonded together, preferably being a single metal block, such as a section of busbar.

Redundant positive conductors (103) connect the redundant positive terminals (101) of source (100) to the redundant positive terminals (107+) of load (105) and redundant negative conductors (104) connect the redundant negative terminals (102) of source (100) to redundant negative terminals (107−) of load (105).

The redundant conductors can be of reduced cross-sectional area compared to the single conductor dimension that would normally have been selected for the required ampacity. For example, suppose that a #1 AWG wire size would normally have been selected to provide an ampacity of 130 amps at 75° C. wire temperature. When two redundant conductors of each polarity are used, they may now be of #4 AWG. Each #4 AWG wire has an ampacity of 85 amps at 75° C., making 170 amps total ampacity. However, this must be derated to 80% if all four #4 AWG conductors share the same conduit, giving 136 amps ampacity. This is still greater than the ampacity of a single #1 AWG wire. Moreover, the cross-sectional area of #4 AWG of 41740 circular mils is almost exactly half the cross-sectional area of 83690 circular mils of #1 AWG, so the amount of copper and therefore the cost of the wire is in principle unchanged. Therefore it is possible to provide the additional conductors required by the invention at in principle zero additional cost.

The redundant positive conductors pass through a current sensor device 106-*a* in the opposite sense on their route between source (100) and load (105). The current flow direction is indicated as opposing by the arrows on the conductors as they crossover within device 106-*a*. As a result, when the current in the two redundant conductors is equal, as it should be in the absence of a fault, no net current flow is sensed within sensor (103). Sensor 103 can for example be a magnetic current sensor such as a Hall Effect device that senses the magnetic field induced by the net current flow. Zero induced magnetic field is an indication of wiring integrity, while a non-zero magnetic field is indicative of a wiring fault. For example, if the wires normally each carry almost equal currents I1 and I2, then the magnetic field in the absence of a fault is proportional to I1−I2, which is small when the currents are almost equal. On the other hand, if one wire becomes open circuit, the entire current I1+I2 flows in the remaining wire and zero current flows in the open wire. Therefore the imbalance current becomes I1+I2 which is much greater than I1−I2, and is thus easily detected as a fault condition. Even a few percent difference in the current, indicative of a poor connection or partially severed wire, is easily detected. Thus bad connections which may have caused arcing in the absence of the invention are detected by the invention, and upon generation of an electrical control signal indicative of the fault, automatic countermeasures may be initiated, such as disconnecting the photovoltaic strings at source from the solar combiner output circuit.

Other configurations of current sensor may be used. For example, the two redundant current carrying conductors can be run in the same direction past a Hall Effect chip, but on opposite sides of the chip. This will also cause cancellation when the currents are equal. Current sensors other than magnetic sensors may also be used. For example, the voltage drop in a very small resistor can be measured by a so-called high-side current sensing amplifier. Using two such sensors with the current flowing through their resistors in opposite directions and adding their outputs, or alternatively allowing the current to flow through their sensing resistors in the same direction and subtracting their outputs will produce the desired cancellation when the current are equal in the absence or a fault condition.

An implementation using high-side current comparison is shown in FIG. 9. Location A (1) and location B (2) represent a source of DC power and a load to be joined. It does not matter which location is the source or which is the load. The fault detector is shown located at location B. Redundant positive conductors 103 join the redundant positive terminals 101 at location A to redundant positive terminals 201,202 of the fault detector at location B. Likewise redundant negative conductors 104 join redundant negative terminals 102 at location A to redundant negative terminals 203,204 of the fault detector at location B. The current in the redundant positive conductors develops small voltage drops across resistors R1 and R2 respectively, which are amplified by the transistor circuit comprising four PNPs and an NPN to provide output voltages at points A, B, C and D, whereupon A-B indicates the current flowing in R1 and C-D indicates the current flowing in R2.

Therefore (A−B)−(C−D) indicates the difference in current flowing in R1 and R2 respectively. Since (A−B)−(C−D)=(A+D)−(B+C), points A and D may be paralleled to a common collector resistor and points B and C may be combined likewise into a common collector resistor. Two wires carrying (A+D) and (B+C) respectively then connect to further circuitry (not shown) to determine current imbalance from the difference between voltages (A+D) and (B+C) and to produce a fault indication in dependence on the current imbalance.

An arrangement of opposite polarity transistors, four NPNs and a PNP, provides differential amplifiers to sense the voltage drops across R3 and R4 respectively, resulting in voltages at points E, F, G and H. Points E and H may be joined and points F and G may be joined and fed to the rest of the circuit (not shown) where (E+H)−(F+G) is formed to provide an indication of current imbalance in the negative conductors.

The entire circuit, including that part of the circuit not shown, may be integrated 235 using a suitable analog integrated circuit process to provide an economic circuit realization having eight inputs for the connections to R1,R2,R2 and R4 and providing four outputs to drive LEDs indicative of which of the four conductors is deemed to be faulty, as well as a control signal indicative of a fault that may be used to shut off power. Opto-isolators may be needed to isolate the fault-detector circuitry, which operates at DC power source potentials, from circuits such as a control processor which may wish to use the fault indications it provides. Such isolation is automatically achieved with magnetic field sensors.

When using the above implementation of the invention, no significant arcing results when a wire or connection becomes bad. This is because the remaining wire or wires provides an effective bypass of the bad wire or connection, limiting the voltage that can be developed across the bad connection to the voltage drop on the remaining wire or wires.

For example, consider a photovoltaic system with a system voltage of 135 volts and a current of 40 amps under normal operation. When wire sizing for a photovoltaic system is carried out according to National Electrical Code (2011) article 690.8, the wire ampacity must be oversized by 156.25% to tolerate long periods of unusually high solar irradiance; thus the required wire ampacity is 1.5625×40=62.5 amps, at least for a single wire, when not using the invention. Overcurrent protection of at least 62.5 amps must also be used, and the next highest standard fuse size is 70 A. A wire size of #6 AWG has an ampacity of 65 amps at 75° C., and is considered to be protected by the 70 amp fuse. A final step in the choice of wire size is to evaluate the voltage drop, which should be less than about 2.5%. With a run of 50 ft, the loop length is 100 ft, and the resistance of 100 ft of #6 AWG is 0.0491 ohms, giving a voltage drop of 1.964 volts. This is less than 2.5% of the system voltage of 135 volts, as is desirable according to good installation practice. The voltage drop across either the positive or negative conductor run alone is half of the above, that is slightly less than 1 volt.

Now consider wire sizing when using the invention. The ampacity of each of the two redundant wires must now be at least 31.25 amps and the next standard fuse size is 35 amps, if a separate fuse is used for each wire. Using a separate fuse for each wire offers protection for the remaining wire if only one wire is shorted to the opposite polarity, but may also blow as it may now be required to pass the whole current.

To divide current flow between two or more parallel paths with proportionally smaller fuses can be considered a safeguard in its own right for mitigating potential arc faults. If one path becomes faulty, the remaining paths will prevent any significant voltage being developed across the fault. If the current in the remaining fuses then rises above their limit, they may also blow, interrupting the circuit.

An arrangement using separate fuses is shown in FIG. 11. A source (or load) at location A is to be connected to a load (or source) at location B. For the purposes of arc-fault suppression alone, it does not matter whether location A or B is the source. However, if the overcurrent devices (211,212) are the main overcurrent devices for protecting the wires (103 or 104), then they should be located at the source of potential fault current. For example, if location A is the PV combiner (700) and location B is the battery (500) of FIGS. 2 and 3, then the source of potential overcurrent for the wiring between the two is the battery. Consequently the fuses (550) of FIGS. 2 and 3 each become replaced by a pair of fuses (211,212) of FIG. 11 when arc fault suppression according to FIG. 11 is introduced.

In FIG. 11, the redundant conductors (103 for the positive conductors or 104 for the negative conductors) each are expected to carry half the normal current. If one of the redundant conductor paths becomes faulty, exhibiting higher resistance than the other, the maximum voltage that can appear across the fault is the voltage drop across the other conductor, which is insufficient to cause an arc. If one conducting path becomes of such high resistance that the other path passes the entire current, which can be up to double its normal current, then there is no problem as long as the current remains below the rating of fuses or overcurrent devices (211,212). If however the current exceeds the fuse rating, the fuse will blow. A detector detects the blown fuse and produces a control signal indicative of a fault which can be used to turn off the power source so that the remaining faulty conductor is de-energized.

Suitable detectors for blown fuses are optoisolators (213, 214) in series with a current limiting resistor connected across the fuse. Upon the fuse becoming open circuit, current flows through the current limiting resistor into the input LED of the optoisolator, causing the output phototransistor of the optoisolator to conduct, thereby generating the desired fault signal. The sense of the connection to the LEDs of the optoisolator must be chosen in relation to the polarity of the wire and the direction of current flow (location A to B. or B to A0. FIG. 11 illustrates the LED connection sense for the source at location A and the positive conductors. In FIG. 11, the optoisolator will produce a fault signal only if the associated fuse has blown and there is a voltage drop across the remaining faulty conductor or more than a few volts, indicative of a bad connection that could cause arcing. A fault signal indicating that one fuse has blown indicates that the other conducting path may be faulty. If both fuses blow, and it is recorded in monitoring circuitry which one blew first and which blew last, that indicates that the conductor associated with the fuse that blew last is the faulty conductor.

Of course it is inconvenient when multiple fuses blow in the event of a fault; however, circuit breakers could be used as an alternative to fuses. For example, a pair of circuit breakers could be used to protect each of two redundant power conductors, the circuit breakers being sized to trip at around half the normal trip current of a prior art single-breaker solution. The breakers may be either (a) ganged such that they both operate if the current in any one exceeds the trip level, thereby preventing current flow in the remaining faulty conductor, or else (b) not ganged, in which case a control signal indicative of the fault shall be generated as discussed in relation to fuses so that the source of power can be shut off to prevent current flow in the remaining faulty conductor. Either arrangement provides mitigation of potential arc faults. Use of separate overcurrent protection devices for each of the redundant power conductors, whether the overcurrent protection devices are fuses or circuit breakers, thus protects the remaining conductors from overcurrent if one conducting path should become inoperable.

Since the inventive fault detection by sensing current imbalance detects a faulty conductor or unequal current sharing between redundant parallel conductors, it is also permissible to use a single fuse, of 70 amps rating in the above example. Thus if the current in either conductor rises even slightly above half normal due to a fault in the other conductor, the fault detector will operate and the source may be shut down before exceeding the ampacity of the remaining conductor can cause any damage.

Returning to the wire sizing calculations, the exemplary array current at maximum solar irradiance is 1.25×40=50 amps, and 25 amps flows on each of the redundant power conductors. The ampacity of the wire derated for conditions of use (temperature and conduit fill) must also exceed the above figure of 25 amps. The derating factor for four conductors in the same conduit is 80%, giving a required ampacity for one wire alone as 25/0.8=31.25 amps before derating. A #10 AWG wire has an ampacity of 35 amps when its temperature is allowed to rise to 75° C., which meets the requirement. The resistance of 100 ft of #10 AWG stranded wire is 0.124 ohms, and using two wires in parallel reduces this to 0.062 ohms. The voltage drop when passing the normal maximum-power current of 40 amps is thus 2.48 volts, which is less than 2.5% of the system voltage, as is desirable. The voltage drop across only the positive wires or only the negative wires is half of the above, or 1.24 volts. If one wire fails, the entire current now passes through the remaining wire, doubling the drop to 2.48 volts. This is the maximum voltage that can appear across a bad connection, and is insufficient to sustain a significant arc. Moreover, the invention rapidly detects the bad connection and provides a control signal to shut off the power source. The amount of copper in two #10 AWG wires is less than the amount of copper in one #6 AWG wire, and so the use of redundant wiring in this example may actually reduce wiring cost.

A suitable magnetic device for sensing a non-zero magnetic field due to DC imbalance current is a Hall Effect sensor. Hall Effect sensor part no. CYSH12AF manufactured by Chen Yang technologies provides a magnetic field detection sensitivity of around 5 to 6 millivolts per milliTesla from its output terminals for a 1-volt drive signal into its input terminals. It is advantageous to use an AC drive signal in order to obtain an AC output signal, which may be amplified without the offset problem of DC amplification. When a drive signal frequency such as 455 KHz or preferably lower is used, a radio IF amplifier chip such as Philips part number SA58640 may be used to amplify the Hall Effect sensor output and provide a Radio Signal Strength Indication (RSSI) related to the magnetic imbalance field strength.

FIG. 5 shows a hypothetical implementation of the invention for the purpose of carrying out some design calculations. A wide printed circuit board track (121) on the upper surface of a printed circuit board funnels current past Hall Effect device (120) from terminal (123) to the diametrically opposite terminal. Solid arrows indicate the current flow lines for this path. A mirror image printed circuit board track (122) on the lower side of the printed circuit board funnels current between the other pair of diametrically opposite terminals. Dashed arrowed lines illustrate the current flow lines on the lower track. It can be seen that the current flow lines on the upper track and lower track are in opposing directions in the narrowest part of the funnel, which is about 0.5 inches wide. The purpose of narrowing the track under the Hall Effect sensor is to increase the current density; however, as the track must pass 40 amps without excessive temperature rise, there is a limit to how narrow it can be. Rough calculations indicate that 0.5 inches is possible, as long as the track rapidly widens to 1.5 inches away from the funnel throat.

Now to detect a 1 amp imbalance in the current between the two redundant conductors, the current density in the funnel is about 79 amps per meter. The magnetic field B just above a current sheet is given by the formula $$B = 0.5 \, \mu J$$

where $\mu$ is the permeability of free space and J is the current density.

With a current density of 79 amps/meter this yields a magnetic field strength of 47.7 microTeslas. Unfortunately, this is only of the same order as the Earth's magnetic field, which would therefore interfere with the measurement.

To cancel the interference from the Earth's magnetic field, it is therefore necessary to place a second Hall Effect Sensor on the opposite side of the tracks where the magnetic field due to the imbalance current is reversed, but where the Earth's magnetic field is in the same direction. Subtracting the outputs of the two Hall Effect sensors thus cancels the interference due to the Earth's magnetic field.

Another issue with the hypothetical arrangement of FIG. 4 is that the magnetic field of a current sheet is parallel to the surface of the sheet—i.e. transverse in FIG. 5, while board-mounted Hall sensors generally detect a field that is perpendicular to the sensor. Both issues are solved by using a magnetic concentrator.

FIG. 6 shows the use of C-cores made of magnetic material (124) as a magnetic concentrator. Ferrite C-cores manufactured by Magnetics Inc. and having a permeability of 5000 are available. Two C-Cores are clamped around the conductor tracks through holes in the printed circuit board and the Hall Effect sensor 120 is installed in a narrow gap between the two C-cores. The high permeability of the magnetic material (124) reduces the reluctance of the magnetic circuit and enhances the magnetic field strength sufficiently that interference from the Earth's magnetic field is no longer a problem. In addition, the magnetic flux now flows perpendicular to the sensor package, as required.

In fact, the printed circuit board current-carrying tracks can be dispensed with, and the redundant current carrying wires joining the source and the load can be threaded through the central window of the magnetic material 124 directly. Gapped toroids are often available for other applications and can be used if the gap is chosen to be in the range 0.05 to 0.1", in order to accommodate the Hall Effect sensor.

The same sensor arrangement of FIG. 6 can be used for an alternative realization of the first implementation of the invention in which equality of the go- and return currents on a pair of conductors of opposite polarity is sensed, as illustrated in FIG. 7. In FIG. 7, one positive and one negative wire are threaded in the same sense through magnetic imbalance current sensor 106-*a*. Now if any one of the four conductors or their respective terminals develops poor conductivity, there will be a shift of current to the other wire of the same polarity. This will upset the balance between the currents in the positive and negative conductors passing through sensor 106-*a*, causing a non-zero magnetic field to be detected indicative of the fault. Thus one current sensor (106-*a*) is capable of detecting a fault on any of the four wires. The second current sensor (106-*b*) is therefore optional, and may be added for additional confirmation of the fault, if desired. Yet another realization of the first implementation of the invention is shown in FIG. 8, which combines the arrangements of FIGS. 4 and 7. Now the two positive conductors are fed through the magnetic current sensor in opposite directions and also the two negative conductors are fed through the same sensor also in opposite directions.

The two positive currents have been labeled Ip1 and Ip2 respectively, and the two negative currents have been labeled In1 and In2. The magnetic current imbalance sensor now senses (Ip1−Ip2)−(In1−In2). This is normally zero.

If the first positive wire goes bad, Ip1 will reduce while Ip2 will increase, and In1 and In2 will remain the same. The imbalance expression therefore takes on a negative value. On the other hand, if the second positive wire goes bad, Ip2 will reduce and Ip1 will increase while In1 and In2 stay in balance. Thus the imbalance expression departs from zero in a positive direction. Likewise faults in either the first or the second negative wires will cause a positive or negative imbalance. Any such imbalance is detected and used to provide an electrical control signal indicative of a fault which may be used to shut off the power source. An advantage of using the two-sensor configuration of FIG. 4 however is that it is possible to identify which of the four conductors has gone bad. The fault can be identified with a positive or a negative conductor according as the sensor on the positive or negative conductors was triggered. The imbalance polarity then indicates which of the pair of redundant conductors had developed a high resistance fault. The fault detector can provide signals that light an LED adjacent to the terminal associated with the bad conducting path, facilitating diagnosis and repair.

It may be convenient and economic to integrate the inventive arc fault detection device into either the solar PV combiner (700) connected as shown in FIGS. 1, 2 and 3 which are described more fully in U.S. Pat. No. 8,937,822 which was incorporated herein above by reference, at the array end of the PV output circuit wiring, or alternatively into an inverter, charge controller or other such device at the other end of the PV output circuit wiring. If the Fault detector is integrated into the PV combiner of the above-incorporated U.S. Pat. No. 8,937,822 having a controlled disconnect feature, then it may be directly connected within the combiner to operate the disconnect feature upon a fault being detected. Because the combiner may be remote from any convenient monitoring location, one or more of the additional wires contemplated by the invention may carry signals to a more convenient monitoring location to provide a fault indication. In the preferred case, the signals provide a fault indication that identifies uniquely which of the power conductors is faulty.

If on the otherhand the inventive wiring fault detector is located in the inverter, one or more of the additional wires is used to carry a disconnect signal to the combiner so that current is shut off at source to prevent flow through the faulty conductor. In this case, the fault indicators may also be integrated into the inverter and operated directly by the fault detector to identify uniquely the faulty power conductor.

Of course it is possible to use more than two redundant conductors. If the number of redundant conductors is even, half of the positive conductors may be threaded through the current imbalance sensor 106-*a* of FIG. 4 in one direction while the other half are threaded through in the opposite direction, and likewise with the negative conductors through current imbalance sensor 106-*b*.

If the number of conductors is odd on the other hand, FIG. 7 may be used by providing current sensors 106-*a*, 106-*b*, 106-*c* . . . etc. for each pair of conductors comprising one positive and one negative conductor or comprising a group of positive conductors and an equal sized group of negative conductors. When the number of sensors is more than two, this arrangement of FIG. 7 can identify a fault to any single wire. The sensor through which the faulty wire passes will show the greatest imbalance, while the remaining sensors will show the imbalance reduced by the factor 1/(n−1) where n is number of imbalance sensors. Having identified the sensor containing the faulty wire, the imbalance sign then identifies the faulty wire as either the positive wire or the negative wire passing through that sensor. When n=2, it is seen that the two sensors always show the same level of imbalance, and therefore it is not possible to uniquely identify the faulty wire using the arrangement of FIG. 7 with only two redundant current paths and associated sensors.

In general, when a plurality of positive and negative conductors are used with one or more imbalance sensors, a variety of ways of threading the conductors through the sensors can be devised by a person skilled in the art to provide wiring fault detection without departing from the spirit or scope of this invention as described by the attached claims.

In the previous example of a 40-amp, 135-volt array, a single #6 AWG circuit was replaced by two #10 AWG redundant current paths for about the same cost. It may also be replaced by three #12 AWG current paths for a possible reduction in the total cost of wire, while still achieving code-compliant ampacity and the voltage drop limits of good installation practice. Thus it is conceivable that a three-sensor version of FIG. 7 for triply redundant wiring would be an economically attractive arrangement.

FIG. 10 illustrates how measurement of other electrical parameters presented by the use of redundant, parallel power conductors can provide wiring fault detection. The redundant power conductors 103 (or 104) pass through magnetic core 206 in the opposite sense. Since the power conductors are shorted together at location A by the redundant terminal block

101 (or 102) and at location B by redundant terminal block (107), the power conductors effectively form a two-turn short-circuited primary winding around the core (206). A secondary winding (109) on the same core will exhibit a much lower inductive impedance when the primary winding is short-circuited. A wiring fault that causes either of the redundant power conductors or the terminal blocks to develop high resistance will however remove or partially remove the short circuit, changing the impedance of the secondary winding. A number of techniques are available to detect a change in impedance of the secondary winding. For example, the secondary winding could be connected in an impedance bridge arrangement excited with a suitable AC source, such as a 1 KHz tone, the bridge being balanced when the power conductors are sound, and becoming unbalanced when they become faulty. The unbalance voltage can be detected and used to generate a control signal indicative of the fault. In the case of 1 KHz tone excitation, the tone output of the bridge could be fed to a small loudspeaker to provide an audible indication of the fault to a person.

Secondary winding 109 may also be used to measure the electrical noise level in the power conductors. Normally, with equal current division between the two power conductors, no signal, AC or DC, is induced in the secondary winding. However, an intermittent connection in either current path will provide a strong signal in the secondary winding having a crackling characteristic, if converted to an audio signal, and of sufficient amplitude to be easily detected. Detection of any such noise signal can be used to provide a control signal indicative of a fault.

It will be appreciated that the arc-fault mitigation techniques described above can be located at the source, at the load or anywhere in between. If the circuit is to be automatically interrupted upon detection of a fault however, the circuit interrupter should be located at the source. The solar combiner described in the above-incorporated U.S. Pat. No. 8,937,822 has a control cable input that can be used to shut off power from the photovoltaic strings. The power wiring fault detector can either be integrated into the combiner to generate a control signal that shuts off power in the event of a fault, or else it can be located at the other end of the control cable to perform the same function. The control signals are envisaged to originate in a DC to AC inverter, which is also a possible location into which the inventive wiring fault detector may be integrated. The circuit interruption however should be located as close to the source as possible, i.e. at the PV combiner (700). Thus additional smaller gauge conductors may be used to transport the control signal from the fault detector at one end to control the interruption device at the other end.

If the fault detector is located at the combiner on the other hand, some additional small-gauge conductors can be used to carry a control signal in the reverse direction to the load location or any other convenient system monitoring location for the purpose of alerting and identifying the nature of the fault to a person.

Attention is now turned to the second implementation of the invention. While the first implementation of the invention verified the correct resistance of a power conductor by comparing the current in it with that of an identical conductor, the second implementation verifies that a conducting path has the correct, low resistance by measuring its voltage drop under load.

U.S. Pat. No. 5,424,894 (Briscal et al, filed Nov. 24, 1992) discloses one method of detecting wiring faults by detecting the voltage drop between source and load. If the voltage drop exceeds a predetermined value indicating excessive heat dissipation in the connection from source to load, the power is interrupted. In order to measure the voltage drop from source to load, the '894 patent disclosed measuring the on-load voltage in one period of time and then periodically interrupting the circuit and measuring the no-load source voltage at another period of time. The method of the '894 patent has the disadvantage however that the load current must be periodically interrupted, and there is therefore a trade off between the fraction of time that the load is interrupted and the speed of detection.

A second implementation of the current invention overcomes that disadvantage of the '894 patent by allowing the introduction of new wires into the wiring system that avoid the need to interrupt the load current, allowing the source and load voltages to be sensed simultaneously. The '894 patent did not introduce additional conductors as it was presumably intended for protection of existing wiring. The current invention however is intended to protect new wiring, and thus the wiring arrangement and the inventive fault detector may be selected together.

The second implementation also comprises using at least one additional wire, typically now of lower gauge than the power wires, to bring a sample of the voltage at one end of a power wire to the same location as the other end of the power wire, where a voltage difference detector then measures the voltage drop across the power wire directly. The lower gauge wire is preferably connected to the power conductors through a current limiting device, such as a resistor, but may be also be connected directly to the extent that the invention is used to shut off power in the event of a fault being detected, thereby preventing overcurrent in the additional wire. A preferred realization of this second implementation measures a first voltage drop along a power wire of first polarity (or phase, such an AC hot leg) as well as measuring a second voltage drop along the power wire of opposite polarity (or phase, such as the neutral of a single phase AC circuit). A fault is indicated in one instance if either the first or the second voltage drop exceeds a preset threshold, or in another alternative a fault is indicated if the first voltage drop and the second voltage drop differ by more than a predetermined fraction.

FIG. 12 shows the arrangement for detecting wiring integrity faults by using an additional wire to facilitate the measurement of voltage drop. Auxiliary positive conductor 104*b*, which may be of small gauge, is run in parallel with the main positive power conductor 103*a* from location A to location B. It thereby makes the potential on the main positive power conductor at location A available to voltage drop sensing circuit (350) at location B. Likewise an auxiliary negative conductor of small gauge 104*b* is run in parallel with main negative power conductor 104*a* to provide a sample of the potential on the negative power conductor at location A to voltage drop sensing circuit 350 at location B. The voltage drop sensing circuit (350) compares the potential on the main positive power conductor 103*a* at its location (location B) with that transported by auxiliary positive conductor 103*b* from location A to determine the voltage drop across positive power conductor 103A. Likewise the voltage drop across the negative power conductor 104*a* is determined. A fault indication is then generated if either voltage drop exceeds preset values. Additionally or alternatively, a fault indication may be generated if the voltage drop on the positive conductor differs too much from the voltage drop on the negative conductor.

The present value of the threshold for determining that a voltage drop is unacceptably high can be either a value, which when multiplied by the expected current would be indicative of excessive heat dissipation in watts at a fault location.

The present voltage drop threshold can also be set by an operator on installation according to the design value of the voltage drop on the cable run. Digital measuring devices could alternatively be used to measure drop and the normally expected value stored upon installation for later use to set the fault threshold. Further details of the voltage drop measuring circuit are omitted for brevity, as such circuits are well within the capability of a person of normal skill in electronics to devise using transistors, resistors and likely optoisolators to isolate output indications and signals from the power circuit.

Two output signals may be generated by the voltage drop sensing circuit upon arriving a fault decision: One signal is sent to operate the DC disconnect device, i.e. to open the relays in PV combiner 700, while the other signal is for operating an indicating device to indicate whether the positive or negative power conductor or both were faulty. If the PV combiner is at location A, the control cable 351 carries the relay operating current, while Fault indication signal 352 operates local fault indicators. If however the voltage drop sensing circuit is part of the PV combiner located at location B, the Fault Indication Signal 352 interrupts the disconnect relay current while control cable 351 carries signals to identify the fault to an operator at location A.

It has thus been described how a simple circuit arrangement using additional conductors, which in preferred implementations do not additional cost to the installation, can be used in an inventive manner with inventive circuitry to anticipate and prevent arc faults. It can be mentioned that, in theory at least, an existing Ground Fault Circuit Interruption device (GFCI breaker) can be deliberately mis-wired so as to perform the invention. This is shown in FIG. 13. Instead of magnetic detection devices 106a and 106b of FIG. 4, FIG. 13 now shows two GFI breakers 106c and 106d. Each GFI breaker has four connections. Two connections are marked "Load" (hot and neutral, if of AC type, and + and -, of DC type) while the other two are marked "load". In FIG. 13, the GFCI breaker 106c is deliberately mis-wired by connecting the redundant positive lines from the power source to one "line" terminal, e.g. the hot or +ve, and to the "load" terminal of the opposite polarity, i.e. neutral, or -ve, while the two redundant positive wires leading to the load are connected to the remaining "line" terminal, and the remaining load terminal.

A second GFCI breaker 106c is mis-wired likewise to the redundant negative conductors. By interchanging one load terminal and one line terminal in this way, current which is flowing in the same direction on the redundant positive conductors is forced to flow in opposite directions through the GFCI breaker. The GFCI breaker does not trip as long as the currents flowing in the two paths is equal and opposite, but will trip if they are not equal. If the breaker is an AC breaker, it will not trip due to a static, DC difference between the currents, however an intermittent connection will cause an AC current with a "crackling" characteristic that will likely trip an AC breaker, as they are sensitive to only 6 mA of imbalance current GFO.

Two regular GFCI breakers may also be wired in a more normal manner theoretically to perform the variation of the invention shown in FIG. 7. However, while regular GFCI breakers may in theory be used to perform the invention of FIG. 4 or 7, in practice, a GFCI DC breaker is likely to be too sensitive to function reliably for the purposes of the invention, and an AC breaker would have to be properly tested and qualified to verify that it would detect and trip on the crackling noise characteristic of a developing arc fault. Therefore, in practice, a specially adapted fault detector device as contemplated by this invention is needed.

I claim:

1. A photovoltaic combiner for combining currents from a number of photovoltaic source circuits each comprising a corresponding string of solar panels and for delivering the combined current to an associated photovoltaic output circuit, the combiner including:

At least one positive terminal and at least one negative terminal for the connection of power conductors to said photovoltaic output circuit;

at least one additional terminal for the connection of at least one conductor additional to said power conductors;

at least one wiring fault detector connected to said power conductors for detecting wiring faults that could potentially lead to arcing and to at least one of said at least one conductors additional to the said power conductors and for providing electrical signals indicative of detected faults on said at least one of said at least one conductors additional to the said power conductors;

a controlled circuit interruption device connected in each of said photovoltaic source circuits, said interruption devices being controllable in dependence on said electrical signals indicative of faults to interrupt the current in said associated photovoltaic source circuits, and a fault indicator controlled by by said signals indicative of faults for providing a fault alert to a human operator.

2. The photovoltaic combiner of claim 1 wherein said controlled circuit interruption devices are controllable in dependence on said electrical signals indicative of faults to interrupt the current in all photovoltaic source circuits including photovoltaic circuits not assciated with said photovoltaic output circuit, thereby interrupting the combined current in all photovoltaic output circuits.

3. The photovoltaic combiner of claim 1 wherein said fault indicator indicates which of said power conductors is faulty.

4. The photovoltaic combiner of claim 1 wherein said fault indicator provides said fault alert to a human operator by the use of light-emitting diodes.

5. The photovoltaic combiner of claim 1 wherein said fault indicator provides said fault alert to a human operator audibly.

6. The photovoltaic combiner of claim 1 wherein said fault indicator is at a remote location and is connected by said at least one additional conductor to said at least one wiring fault detector.

7. A photovoltaic combiner for combining currents from a number of photovoltaic source circuits each comprising a corresponding string of solar panels and for delivering the combined current to a photovoltaic output circuit, the combiner including:

At least one positive terminal and at least one negative terminal for the connection of corresponding power conductors to each of said photovoltaic source circuits and to said photovoltaic output circuit;

at least one additional terminal for the connection of at least one conductor additional to said power conductors;

at least one wiring fault detector connected to any of said power conductors for detecting wiring faults that could potentially lead to arcing and to at least one of said at least one conductors additional to said power conductors and for providing electrical signals on said at least one of said at least one conductors additional to said power conductors indicative of detected faults;

a controlled circuit interruption device connected in each of said photovoltaic source circuits, the interruption device being controlled by said electrical signals indicative of faults to interrupt the current in the associated photovoltaic source circuit, and a fault indicator for providing a fault alert to a human operator.

8. The photovoltaic combiner of claim 7 wherein said electrical signals indicative of faults control said controlled circuit interruption devices to interrupt the current in all of said photovoltaic source circuits thereby interrupting the combined current in said photovoltaic output circuit.

9. The photovoltaic combiner of claim 7 wherein said electrical signals indicative of detected faults indicate which of said power conductors is faulty.

10. The photovoltaic combiner of claim 7 wherein said fault indicator provides said fault alert to a human operator by the use of light-emitting diodes.

11. The photovoltaic combiner of claim 7 wherein said fault indicator provides said fault alert to a human operator audibly.

12. A photovoltaic combiner for combining currents from a number of photovoltaic source circuits each comprising at least one string of solar panels and delivering the combined current to a photovoltaic output circuit, the combiner including:

At least one positive and at least one negative terminal for connecting corresponding power conductors to said photovoltaic source circuits and to said photovoltaic output circuit;

for each of said photovoltaic source circuits and said photovoltaic output circuit, at least one terminal additional to the corresponding ones of said positive and negative terminals for the connection of a corresponding at least one conductor additional to the corresponding ones of said power conductors;

a controlled circuit interruption device connected in each of said photovoltaic source circuits for interrupting the current in the associated photovoltaic source circuit;

an electrical circuit arrangement for controlling said controlled circuit interruption devices to interrupt or to pass current from said photovoltaic source circuits, said electrical circuit arrangement comprising at least one wiring fault detector connected to said power conductors and said corresponding additional conductors for detecting faults in said power conductors that could potentially lead to arcing and for providing corresponding fault indications, said electrical circuit arrangement being configured to select the photovoltaic source circuits to be interrupted based on said fault indications.

13. The photovoltaic combiner of claim 12 further comprising a fault indicator for providing a fault alert to a human operator and for indicating which power conductor or conductors caused the fault alert by means of light emitting diodes located proximate to respective power conductors and illuminating the light emitting diode proximate to the faulty power conductor.

14. The photovoltaic combiner of claim 12 further comprising a fault indicator for providing an audible alert to a human operator when said fault indication indicates that the fault lies in the power conductors of the photovoltaic output circuit and said selected photovoltaic source circuits to be interrupted include all photovoltaic source circuits.

* * * * *